United States Patent
Tanno et al.

(10) Patent No.: US 11,021,810 B2
(45) Date of Patent: Jun. 1, 2021

(54) LITHIUM TANTALATE SINGLE CRYSTAL SUBSTRATE, BONDED SUBSTRATE, MANUFACTURING METHOD OF THE BONDED SUBSTRATE, AND SURFACE ACOUSTIC WAVE DEVICE USING THE BONDED SUBSTRATE

(71) Applicant: SHIN-ETSU CHEMICAL CO., LTD., Tokyo (JP)

(72) Inventors: Masayuki Tanno, Annaka (JP); Jun Abe, Annaka (JP); Koji Kato, Annaka (JP); Yoshinori Kuwabara, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 550 days.

(21) Appl. No.: 15/566,247

(22) PCT Filed: Apr. 6, 2016

(86) PCT No.: PCT/JP2016/061226
§ 371 (c)(1),
(2) Date: Oct. 13, 2017

(87) PCT Pub. No.: WO2016/167165
PCT Pub. Date: Oct. 20, 2016

(65) Prior Publication Data
US 2018/0080144 A1 Mar. 22, 2018

(30) Foreign Application Priority Data
Apr. 16, 2015 (JP) .............................. JP2015-083941

(51) Int. Cl.
*C30B 29/30* (2006.01)
*C30B 31/02* (2006.01)
(Continued)

(52) U.S. Cl.
CPC .............. *C30B 29/30* (2013.01); *C01D 15/02* (2013.01); *C01G 33/00* (2013.01); *C01G 35/00* (2013.01);
(Continued)

(58) Field of Classification Search
CPC ......... C30B 29/30; C30B 31/02; C30B 33/06; C04B 37/00; C04B 37/02; H03H 9/25
See application file for complete search history.

(56) References Cited

U.S. PATENT DOCUMENTS 6,652,644 B1    11/2003  Miller et al.
2003/0127042 A1  7/2003  Tsou et al.
(Continued)

FOREIGN PATENT DOCUMENTS

| CN | 101608342 A | 12/2009 |
| CN | 103999366 A | 8/2014 |

(Continued)

OTHER PUBLICATIONS

European Patent Office, English computer translation of JP2013236276. (Year: 2020).*
(Continued)

*Primary Examiner* — Matthew J Song
(74) *Attorney, Agent, or Firm* — Oblon, McClelland, Maier & Neustadt, L.L.P.

(57) ABSTRACT

[Object]
It is an object of the present invention to provide a lithium tantalate single crystal substrate which undergoes only small warpage, is free from cracks and scratches, has better temperature non-dependence characteristics and a larger electromechanical coupling coefficient than a conventional Y-cut $LiTaO_3$ substrate.
[Means to solve the Problems]
The lithium tantalate single crystal substrate of the present invention is a rotated Y-cut $LiTaO_3$ single crystal substrate
(Continued)

having a crystal orientation of 36° Y-49° Y cut characterized in that: the substrate is diffused with Li from its surface into its depth such that it has a Li concentration profile showing a difference in the Li concentration between the substrate surface and the depth of the substrate; and the substrate is treated with single polarization treatment so that the Li concentration is substantially uniform from the substrate surface to a depth which is equivalent to 5-15 times the wavelength of either a surface acoustic wave or a leaky surface acoustic wave propagating in the $LiTaO_3$ substrate surface.

14 Claims, 4 Drawing Sheets

(51) Int. Cl.
| | |
|---|---|
| C30B 33/06 | (2006.01) |
| C04B 37/00 | (2006.01) |
| C04B 37/02 | (2006.01) |
| C30B 33/04 | (2006.01) |
| C01D 15/02 | (2006.01) |
| C01G 33/00 | (2006.01) |
| C01G 35/00 | (2006.01) |
| C30B 29/60 | (2006.01) |
| H03H 9/02 | (2006.01) |

(52) U.S. Cl.
CPC ............ *C04B 37/00* (2013.01); *C04B 37/02* (2013.01); *C30B 29/605* (2013.01); *C30B 31/02* (2013.01); *C30B 33/04* (2013.01); *C30B 33/06* (2013.01); *H03H 9/02559* (2013.01); *C01P 2002/90* (2013.01); *C04B 2237/343* (2013.01); *C04B 2237/365* (2013.01)

(56) References Cited

U.S. PATENT DOCUMENTS

| | | | | |
|---|---|---|---|---|
| 2010/0088868 | A1* | 4/2010 | Kando | H01L 41/257 |
| | | | | 29/25.35 |
| 2010/0156241 | A1* | 6/2010 | Suzuki | H01L 41/337 |
| | | | | 310/325 |
| 2014/0210316 | A1 | 7/2014 | Hori et al. | |
| 2015/0294900 | A1* | 10/2015 | Goto | B32B 38/0008 |
| | | | | 428/620 |
| 2017/0054068 | A1 | 2/2017 | Masayuki et al. | |

FOREIGN PATENT DOCUMENTS

| | | | | |
|---|---|---|---|---|
| CN | 106464228 A | | 2/2017 | |
| JP | 2003-207671 A | | 7/2003 | |
| JP | 2011-135245 A | | 7/2011 | |
| JP | 2013-66032 A | | 4/2013 | |
| JP | 2013066032 A | * | 4/2013 | ............... H03H 9/25 |
| JP | 2013-236276 A | | 11/2013 | |
| JP | 2013-236277 A | | 11/2013 | |
| JP | 2013236276 A | * | 11/2013 | ............... H03H 9/25 |
| JP | 2013236277 A | * | 11/2013 | ............... H03H 9/25 |
| JP | 2014-27388 A | | 2/2014 | |
| JP | 2014-154911 A | | 8/2014 | |
| JP | 2014154911 A | * | 8/2014 | ............... H03H 3/08 |
| WO | WO 2013/135886 A1 | | 9/2013 | |

OTHER PUBLICATIONS

European Patent Office, English computer translation of JP2013066032. (Year: 2019).*
European Patent Office, English computer translation of JP2013236277. (Year: 2019).*
European Patent Office, English computer translation of JP2014154911. (Year: 2019).*
International Search Report dated May 10, 2016, in PCT/JP2016/061226, filed Apr. 6, 2016.
Bartasyte, A., et al., "Reduction of Temperature Coefficient of Frequency in $LiTaO_2$ Single Crystals for Surface Acoustic Wave Applications", Applications of Ferroelectrics held jointly with 2012 European Conference on the Applications of Polar Dielectrics and 2012 International Symp Piezoresponse Force Microscopy and Nanoscale Phenomena in Polar Materials (ISAF/ECAPD/PFM), 2012, pp. 1-3.
Chinese Office Action dated Nov. 5, 2019, in Patent Application No. 201680022206.1, 13 pages (with English translation).
Office Action dated Nov. 11, 2020 in Chinese Patent Application No. 201680022206.1, (with English Translation).

* cited by examiner

LITHIUM TANTALATE SINGLE CRYSTAL SUBSTRATE, BONDED SUBSTRATE, MANUFACTURING METHOD OF THE BONDED SUBSTRATE, AND SURFACE ACOUSTIC WAVE DEVICE USING THE BONDED SUBSTRATE

TECHNICAL FIELD

The present invention relates to a lithium tantalate single crystal substrate, a bonded substrate thereof, a manufacturing method of the bonded substrate, and a surface acoustic wave device using such bonded substrate.

BACKGROUND ART

A surface acoustic wave (SAW) device formed with a comb-like electrode (IDT: Interdigital Transducer) for exciting a surface acoustic wave on a piezoelectric substrate is used as a component for frequency adjustment and selection of a mobile phone or the like.

For this surface acoustic wave device, a piezoelectric material such as lithium tantalate ($LiTaO_3$ or LT) and lithium niobate ($LiNbO_3$ or LN) is used to make the base substrate, because piezoelectric materials meet the requirements of small size, small insertion loss, and ability to stop passage of unnecessary waves.

Now, on one hand, the communication standards for the fourth generation cellular phones call for a narrow difference in frequency band between transmission and reception as well as a wide bandwidth, but on the other hand, under such communication standards, unless the property changes induced by temperature change of the material of the surface acoustic wave device are sufficiently small, there occurs a shift in the frequency selection range, which results in problematic hindrance to the filter and duplexer functions of the device. Therefore, a material for a surface acoustic wave device having small tendency to undergo fluctuation in properties with respect to temperature change and having a wide band is eagerly called for.

Regarding such material for the surface acoustic wave device, for example, IP Document 1 teaches that a stoichiometric composition LT composed of copper used as an electrode material and commonly obtained by a gas phase method is preferable because the breakdown mode of sudden rupture at the moment when high power is input to the IDT electrode is hard to occur. Also, IP Document 2 has a detailed description on the stoichiometry composition LT obtained by the gas phase method; and likewise, IP Document 3 describes a detailed method of conducting an annealing upon a waveguide formed in a ferroelectric crystal of lithium tantalate or lithium niobate.

Further, IP Document 4 describes a piezoelectric substrate for a surface acoustic wave device obtained by subjecting a single crystal substrate of lithium tantalate or lithium niobate to Li diffusion treatment, and IP Document 5 and Non-IP Document 1 also report that, when LT in which the LT composition was uniformly transformed to be Li-rich from the surface to a depth by a gas phase equilibrium method was used to make the surface acoustic wave element, its frequency stability against temperature change was improved, hence preferable.

PRIOR ART DOCUMENTS

IP Publications

IP Publication 1: Japanese Patent Application Publication No. 2011-135245

IP Publication 2: U.S. Pat. No. 6,652,844 (B1)

IP Publication 3: Japanese Patent Application Publication No. 2003-207671

IP Publication 4: Japanese Patent Application Publication No. 2013-66032

IP Publication 5: WO2013/135886(A1)

Non-IP Publications

Bartasyte, A. et. al, "Reduction of temperature coefficient of frequency in $LiTaO_3$ single crystals for surface acoustic wave applications" Applications of Ferroelectrics held jointly with 2012 European Conference on the Applications of Polar Dielectrics and 2012 International Symp Piezoresponse Force Microscopy and Nanoscale Phenomena in Polar Materials (ISAF/ECAPD/PFM), 2012 Intl Symp, 2012, Page(s): 1-3

SUMMARY OF THE INVENTION

Problems to be Solved by Invention

However, as the inventors of the present invention have examined the methods described in these publications, it has been found that these methods do not necessarily provide favorable results. In particular, according to the method described in IP Document 5, the wafer is processed at a high temperature of about 1300° C. in the vapor phase, and the manufacturing temperature also has to be as high as about 1300° C., so that the consequent warpage of the wafer would be large, and cracks can occur at a high rate, whereby the productivity becomes poor, and there is also a problem that the product becomes overly expensive as a material for a surface acoustic wave device. Moreover, in this manufacturing method, the vapor pressure of $Li_2O$ is so low that the modification degree of the sample to be modified varies significantly depending on the distance from the Li source, and the resulting problem of fluctuation in quality of the product is making industrialization thereof obstructed.

Furthermore, in the manufacturing method described in IP Document 5, a single polarization treatment is not performed on the lithium-enriched LT after the modification by the gas phase equilibrium method, and as a result of exploration on this point by the present inventors, it was newly found that with the LT that is modified to be Li-rich but is not subjected to a single polarization treatment there occurs a problem that the value Q of the SAW device ends up small.

The present invention has been made in view of the above circumstances, and an object of the present invention is to provide a method for manufacturing a lithium tantalate single crystal substrate which incurs only small warpage, scarcely has cracks and scratches, undergoes smaller property changes with temperature than conventional rotated Y-cut $LiTaO_3$ substrates do, and renders a high electromechanical coupling coefficient and high values of Q in the device; the invention also seeks to provide a bonded substrate obtained by bonding the above-mentioned lithium tantalate single crystal substrates, a method for manufacturing the above mentioned bonded substrate, and eventually a surface acoustic wave device using such substrate.

As a result of extensive studies to achieve the above object, the present inventors came to find that it is possible to obtain a piezoelectric oxide single crystal substrate which, when employed as a surface acoustic wave element or the like, will incur only small warpage, have scarce cracks and scratches, and undergo reduced property changes with temperature without having to go so far as to modify the substrate to create a crystalline structure having a uniform Li concentration in a range extending close to the core of the substrate in the thickness direction, if the following procedure is conducted, namely, to apply vapor phase Li diffusion treatment to a substrate having a substantially congruent composition to thereby create in it such a modified area wherein the Li concentration profile as taken in the thickness direction shows a higher Li concentration at a measurement point closer to the surface of the substrate and a lower Li concentration at a measurement point closer to the core of the substrate. In addition, the inventors have found that the range of the modification by the Li diffusion as well as whether or not the single polarization treatment is conducted are liable to affect the value Q of the device, and hence they possessed the present invention.

Means for Solving the Problem

Therefore, the lithium tantalate single crystal substrate of the present invention is a rotated Y-cut $LiTaO_3$ single crystal substrate having a crystal orientation of 36° Y-49° Y cut characteristic in that: it received an Li diffusion from its surface into its depth with a result that the Li concentration profile shows a difference in Li concentration between the surface of the substrate and an inner part of the substrate; and it received a single polarization treatment with a result that Li concentration is roughly uniform from the surface of the substrate to a depth which is 5-15 times the wavelength of a surface acoustic wave or a leaky surface acoustic wave propagating in the $LiTaO_3$ substrate surface.

In the present invention it is preferable that the Li concentration profile shows that the Li concentration is higher at a point closer to the surface of the rotated Y-cut $LiTaO_3$ substrate and the Li concentration is lower at point closer to the core of the substrate, and that the ratio of Li to Ta at the surface of the substrate is such that: Li:Ta=50−α:50+α, where α is in the range of −0.5<α<0.5. It is also preferable that Fe is doped in the substrate at a concentration of 25 ppm to 150 ppm.

In addition, the lithium tantalate single crystal substrate of the present invention can be bonded to a base substrate to form a bonded substrate. In that case, it is preferable to remove the $LiTaO_3$ surface layer from the surface opposite to the bonding surface in a manner such that at least a part of the portion in which the Li concentration is substantially uniform, to form a bonded substrate; also, the base substrate is preferably made of Si, SiC, or spinel.

Furthermore, the method of manufacturing a bonded substrate according to the present invention is characterized in that a $LiTaO_3$ single crystal substrate having a substantially uniform Li concentration is bonded to a base substrate to thereby leave at least a part of the portion in which the Li concentration is substantially uniform, or that the $LiTaO_3$ surface layer is removed from the surface opposite to the bonding surface so as to leave only that portion in which the Li concentration is substantially uniform, and the method is also characteristic in that the said portion in which the Li concentration is substantially uniform is of a pseudo stoichiometric composition.

The lithium tantalate single crystal substrate and the bonded substrate of the present invention are suitable as a material for the surface acoustic wave device.

Effects of the Invention

According to the present invention, it is possible to provide a lithium tantalate single crystal substrate having better temperature non-dependency characteristics than the conventional rotated Y-cut $LiTaO_3$ substrates, having a large electromechanical coupling coefficient and having high values Q of the device. In addition, the surface acoustic wave device using this single crystal substrate can be provided at a low price and is suitable for a broadband band which is required for a smartphone.

EMBODIMENTS FOR CARRYING OUT THE INVENTION

Figure 1:
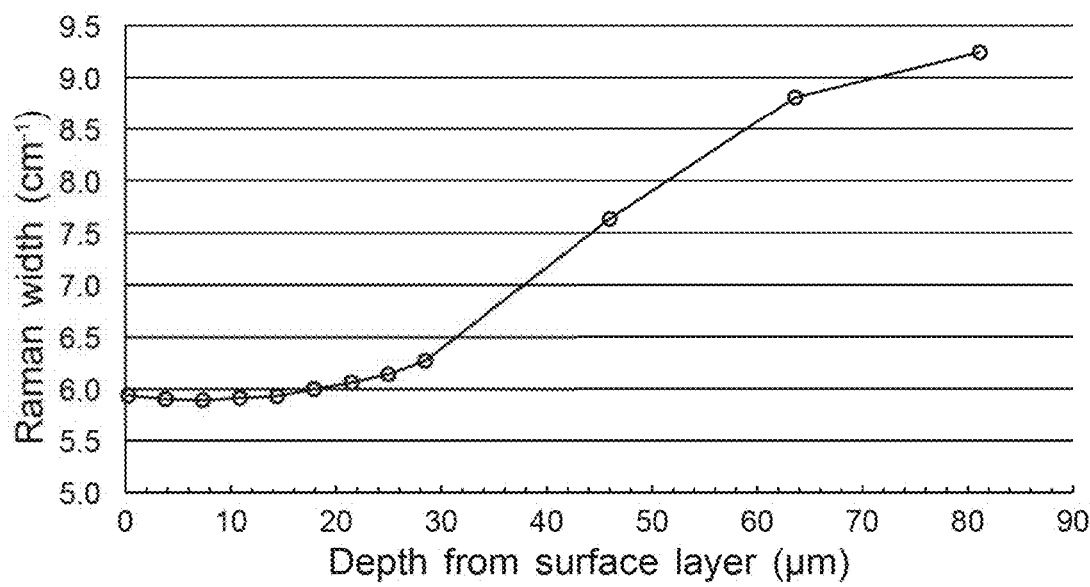
FIG. 1 A diagram showing a Raman profile of Example 1.

Hereinafter, embodiments of the present invention will be described in detail, but the present invention is not limited to these embodiments.

The lithium tantalate single crystal substrate of the present invention has a concentration profile in which the Li concentration is different between the substrate surface and an inner part of the substrate. It is preferable from the viewpoint of easiness in fabrication for the substrate to have a region in which the concentration profile is such that the Li concentration is higher in an area closer to the substrate surface in the thickness direction of the substrate and the Li concentration is lower in an area closer to the substrate core. Such a substrate having a region showing the above-described concentration profile of Li can be easily produced by diffusing Li from the substrate surface by any known method. Here, the "concentration profile" refers to a continuous (non-stepped) change in concentration.

The lithium tantalate single crystal substrate of the present invention is characteristic in that it has a substantially uniform Li concentration in a region between its surface and its depth which is 5-15 times the wavelength of a surface acoustic wave or a leaky surface acoustic wave propagating in the surface of the $LiTaO_3$ substrate. This is because a $LiTaO_3$ substrate having a region wherein Li concentration is substantially uniform ranging from the substrate surface to a depth equivalent to at least 5 times the wavelength of a surface acoustic wave or a leaky surface acoustic wave propagating in the surface of the $LiTaO_3$ substrate would show about the same or larger value of Q as compared with a $LiTaO_3$ substrate not subjected to Li diffusion treatment. If the region having substantially uniform Li concentration is set to have a depth exceeding 15 times the said wavelength, it takes unreasonably long time to diffuse Li, resulting in poor productivity, and in addition the longer time of Li diffusion is, the greater becomes the possibility for the substrate to incur a warpage or a crack.

The Li concentration of the lithium tantalate single crystal can be evaluated by measuring the Raman shift peak. With regard to lithium tantalate single crystals, it is known that a roughly linear relationship can be obtained between the half-value width of the Raman shift peak and the Li concentration, i.e., Li/(Li+Ta). [Ref. non-IP publication: 2012 IEEE International Ultrasonics Symposium Proceedings, page(s): 1252-1255, Applied Physics A 56, 311-315 (1993)] Therefore, by using a formula representing such a relationship, it is possible to evaluate the composition at an arbitrary position of the oxide single crystal substrate.

A formula representing a relationship between the half-value width of the Raman shift peak and the Li concentration is obtained by measuring the Raman half-value width for some samples having a known composition and different Li concentrations; so long as the conditions of Raman measurement are the same, it will do to use a formula already disclosed in literature, etc. For example, for lithium tantalate single crystal, the following formula (1) may be used.

⟨ Equation 1 ⟩

$$Li/(Li+Ta)=(53.15-0.5FWHM_1)/100 \quad (1)$$

wherein, "FWHM1" is the half-value width of the Raman shift peak around 600 cm$^{-1}$; for details of measurement conditions, refer to any relevant publication.

For the purpose of the present invention "the region wherein the Li concentration is substantially uniform ranging from the substrate surface" means a region in which the Raman shift peak's half-value width around 600 cm$^{-1}$ is in the range of ±0.2 cm$^{-1}$ or so of that at the surface of the substrate or a region in which the value of Li/(Li+Ta) is in the range of ±0.001 or so of that at the surface of the substrate.

The lithium tantalate single crystal substrate of the present invention is characteristic in that it has received a single polarization treatment for this treatment renders the value Q of the substrate greater than that in the case of a substrate without polarization treatment; it is preferable that this polarization treatment is conducted after the Li diffusion treatment.

Further, in the lithium tantalate single crystal substrate of the present invention, the ratio of Li to Ta at the substrate surface is preferably Li:Ta=50−α:50+α where α is in the range of −0.5<α<0.5. This is because if the ratio of Li to Ta at the surface of the substrate is within the above range, the substrate surface can be deemed to be of pseudo-stoichiometric composition, and exhibits particularly excellent temperature non-dependency characteristics.

The lithium tantalate single crystal substrate of the present invention can be produced, for example, by subjecting an oxide single crystal substrate having a substantially congruent composition to a vapor phase treatment for diffusing Li from the surface of the substrate to the inside thereof. The oxide single crystal substrates having a substantially congruent composition can be obtained by creating a single crystal ingot through a known method such as Czochralski method, slicing the ingot into wafers and, if necessary, lapping or polishing the wafers.

Further, the lithium tantalate single crystal substrate of the present invention may be doped with Fe at a concentration of 25 ppm to 150 ppm. This is because a lithium tantalate single crystal substrate doped with Fe at a concentration of 25 ppm to 150 ppm allows itself to be diffused with Li at rate about 20% faster than in the case of one doped with no Fe, and thus the productivity of the Li-diffused lithium tantalate wafer is substantially improved—hence the preference. As a procedure for effecting a doping of Fe in a lithium tantalate single crystal substrate, it is possible to add an appropriate amount of $Fe_2O_3$ to the raw material when raising a single crystal ingot by Czochralski method.

Furthermore, the polarization treatment to be carried out in the present invention may be performed by any known method, and as for the vapor phase treatment, although it is conducted in the examples below with the substrate buried in a powder consisting mainly of $Li_3TaO_4$, it should be construed that the invention is not limited to the kind or the form of the materials used in the vapor phase treatment in the examples. Further, as for the substrate subjected to the vapor phase treatment, additional processing and treatment may be carried out, if need be.

The lithium tantalate single crystal substrate of the present invention can be bonded to various base substrates to form a bonded substrate. The base substrate to which the inventive substrate is bonded is not particularly limited, and can be selected according to the purpose; but it is preferably one made of Si, SiC, or spinel.

Also, in the case of manufacturing the bonded substrate of the present invention, it is possible to remove the $LiTaO_3$ surface layer from the surface opposite to the bonding surface in a manner such that at least a part of the region in which the Li concentration is substantially uniform is left, so as to obtain a bonded substrate having excellent characteristics for a surface acoustic wave device.

The surface acoustic wave device manufactured using the lithium tantalate single crystal substrate or the bonded substrate of the present invention would have excellent temperature non-dependency characteristics and is particularly suitable as a component for a fourth generation mobile phone or the like.

EXAMPLES

Hereinafter, examples of the present invention and comparative examples will be described more specifically.

Example 1

In Example 1, at first, a singly polarized 4-inch diameter lithium tantalate single crystal ingot having a substantially congruent composition and having a Li:Ta ratio of 48.5:51.5 was sliced to obtain a number of 370-μm-thick 42° rotated Y-cut lithium tantalate substrates. Thereafter, in view of a protocol, the surface roughness of each sliced wafer was adjusted to 0.15 μm in terms of arithmetic average roughness value Ra by a lapping step, and the finished thickness was set to 350 μm (micrometer).

Subsequently, both side surfaces of the substrates (wafers) were finished into a quasi-mirror finish having an Ra value of 0.01 μm by planar polishing, and the substrates were buried in a powder composed of Li, Ta and O, mainly consisting in the form of $Li_3TaO_4$. The power consisting mainly in the form of $Li_3TaO_4$ which was used in this example was prepared by mixing $Li_2CO_3$ and $Ta_2O_5$ powders in a molar ratio of 7:3 in this order and subjecting the thus obtained mixture to a calcination at 1300° C. for 12 hours. The powder consisting mainly in the form of $Li_3TaO_4$ was spread in a small container, and a plurality of slice wafers were buried in the $Li_3TaO_4$ powder.

Then, this small container was set in an electric furnace and the inside of the furnace was replaced by an $N_2$ atmosphere before the furnace was electrified to heat at 975° C. for 100 hours whereupon Li diffused from the surface of the sliced wafer toward the middle part thereof. Thereafter, while the temperature of the wafer was allowed to lower, a 12-hour annealing treatment at 800° C. was applied to the wafer; then as the temperature went down from 770° C. to 500° C., an electric field of approximately 4000 V/m was applied in a substantially +Z direction; and thereafter the temperature was let to fall to the room temperature. After this treatment, one side of the wafer was subjected to a finishing work consisting of sandblasting whereby this side's Ra value became about 0.15 μm; on the other hand, the other quasi-mirror finish surface was subjected to a 3 μm polishing and in this manner a plurality of lithium tantalate single crystal substrates were made.

With regard to one of these lithium tantalate single crystal substrates, a laser Raman spectrometer (LabRam HR series manufactured by HORIBA Scientific Inc., Ar ion laser, spot size 1 μm, room temperature) was used to measure the half-value width of the Raman shift peak around 600 $cm^{-1}$, which is an indicator of the Li diffusion amount, with respect to a depth-wise distance from the surface at an arbitrarily chosen site which was 1 cm or more away from the outer circumference of the circular substrate; and as the result a Raman profile as shown in FIG. 1 was obtained.

According to the result of the profile shown in FIG. 1, while the value of the Raman half-value width at the surface of this lithium tantalate single crystal substrate differed from that in an in-depth part of the substrate, the value of the Raman half-value width was more or less constant, namely between 5.9 and 6.0 $cm^{-1}$ in the area of the depth from 0 μm through about 18 μm in the thickness direction. In the deeper area, it was confirmed that the value of the Raman half-value width tended to increase as the measuring point moved closer to the middle of the substrate.

The Raman half-value width at a depth of 80 μm in the thickness direction of the lithium tantalate single crystal substrate was 9.3 $cm^{-1}$, and although not shown in the figure, the Raman half-value width at the thickness-wise middle position of the substrate was also 9.3 $cm^{-1}$.

From the above results of FIG. 1 it was confirmed that in Example 1 the Li concentration in the vicinities of the substrate surface and that inside the substrate are different and that the substrate has a region which exhibits a concentration profile such that the Li concentration is higher in areas closer to the substrate surface, and the Li concentration decreases with depth of the substrate in the thickness direction. It was also confirmed that the Li concentration was roughly uniform up to the depth of 18 μm from the $LiTaO_3$ substrate surface.

Further, from the results of FIG. 1, the Raman half-value width is about 5.9-6.0 $cm^{-1}$ from the surface of the lithium tantalate single crystal substrate through to the depth of 18 μm in the thickness direction, wherefore, using the equation (1), the composition in that range is roughly Li/(Li+Ta) =0.515 through 0.52, so it was confirmed that the composition there was pseudo-stoichiometric.

Further, since the Raman half-value width at the middle portion in the thickness direction of the substrate of the lithium tantalate single crystal is about 9.3 $cm^{-1}$, when, similarly as above, the formula (1) is adopted, the value of Li/(Li+Ta) becomes 0.485, wherefore it was confirmed that the middle portion of the substrate was of a substantially congruent composition.

As described above, in the case of the rotated Y-cut $LiTaO_3$ substrate of Example 1, the region between the surface of the substrate and the position at which the Li concentration starts decreasing as well as the region between the position at which the Li concentration stops increasing and the other side surface of the substrate are of a pseudo-stoichiometric composition, and the middle part in the thickness direction is of a substantially congruent position. The position at which the Li concentration starts decreasing or the position at which the Li concentration stops increasing were at a position of 20 μm from the substrate surface in the thickness direction, respectively.

Next, warping of this 4-inch lithium tantalate single crystal substrate subjected to Li diffusion was measured by interference measuring method using a laser light, and the value was as small as 60 μm, and chipping and crack were not observed.

Next, a small piece was cut out from the Li-diffused 4-inch 42° rotated Y cut lithium tantalate single crystal substrate, and, in a Piezo d33/d15 meter (model ZJ-38N) manufactured by The Institute of Acoustics of the Chinese Academy of Sciences, the small piece was given a vertical vibration in the thickness direction to the principal face and also to the back face respectively to observe the voltage waveform thereby induced, and a waveform was observed at every position all over the wafer which indicated a presence of piezoelectric response. Hence it was confirmed that the lithium tantalate single crystal substrate of Example 1 has piezoelectricity at every site on the substrate surface, and thus can be used as a singly polarized surface acoustic wave device.

Next, a 42° Y-cut lithium tantalate single crystal substrate of Example 1 which had been subjected to the Li diffusion treatment was exposed to a sputtering treatment to receive on its surface an Al film having a thickness of 0.2 μm, and a resist material was applied to the thus treated substrate; then, a one-stage ladder type filter and an electrode pattern for a resonator were exposed and developed in a stepper, and an electrode for a SAW device was produced by means of RIE (Reactive Ion Etching).

Now, one wavelength of this patterned one-stage ladder type filter electrode was set to 2.33 μm in the case of the series resonator and one wavelength of the parallel resonator was set to 2.47 μm. Furthermore, an evaluation-purpose single resonator was configured to have a wavelength of 2.50 μm.

Figure 2:
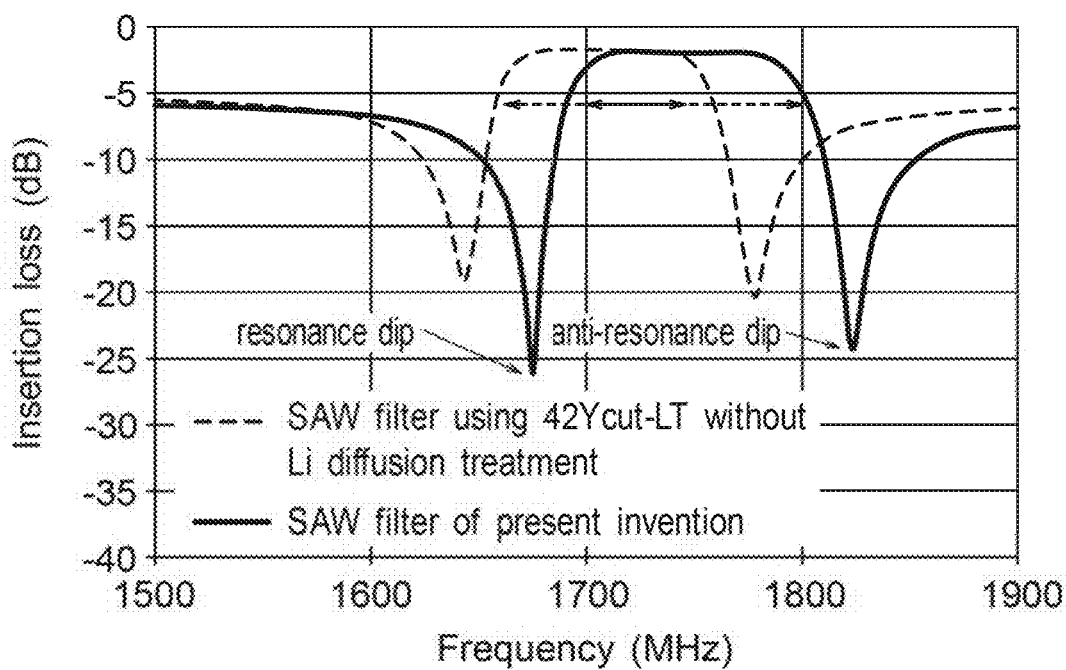
FIG. 2 A diagram showing an insertion loss waveform of the SAW filter of Example 1.

With regard to this one-stage ladder type filter, the SAW waveform characteristic was explored by means of an RF prober, and the results shown in FIG. 2 were obtained. In FIG. 2, for the sake of comparison, the results of measurement of the SAW waveform in the case of a 42° Y-cut lithium tantalate single crystal substrate which was not subjected to Li diffusion treatment and was formed with a similar electrode as that described above are also shown in FIG. 2.

From the results shown in FIG. 2, in the SAW filter made of a 42° Y-cut lithium tantalate single crystal substrate subjected to Li diffusion treatment, the frequency span at which the insertion loss is 3 dB or less was confirmed to be 93 MHz, and the center frequency to be 1745 MHz. On the other hand, in the SAW filter made of a 42° Y-cut lithium tantalate single crystal substrate not subjected to Li diffusion treatment, the frequency span at which the insertion loss is 3 dB or less was 80 MHz, and the center frequency was 1710 MHz.

Also, while changing the temperature of the stage from about 16° C. to 70° C., the anti-resonance frequency corresponding to the frequency on the right side of the dip in FIG. 2 and the temperature coefficient of the resonance frequency corresponding to the frequency on the left side of the dip were examined and, as the result, since the temperature coefficient of the resonance frequency was −21 ppm/° C. and the temperature coefficient of the anti-resonance frequency was −42 ppm/° C., it was confirmed that the average frequency temperature coefficient was −31.5 ppm/° C. For comparison, the temperature coefficient of the 42° Y-cut lithium tantalate single crystal substrate not subjected to the Li diffusion treatment was also examined and, as the result, since the temperature coefficient of the resonance frequency was −33 ppm/° C. and the temperature coefficient of the anti-resonance frequency was −43 ppm/° C., the average frequency temperature coefficient was confirmed to be −38 ppm/° C.

Therefore, from the above results, it was confirmed that in the lithium tantalate single crystal substrate of Example 1, the band in which the insertion loss of the filter was 3 dB or less was 1.2 times wider as compared with the substrate not subjected to the Li diffusion treatment. With regard to the temperature-dependency characteristics as well, the average frequency temperature coefficient was about 6.5 ppm/° C. lower than that of the substrate not subjected to the Li diffusion treatment, so that the property fluctuation with temperature is small and thus the stability against temperature change was confirmed to be good.

Figure 3:
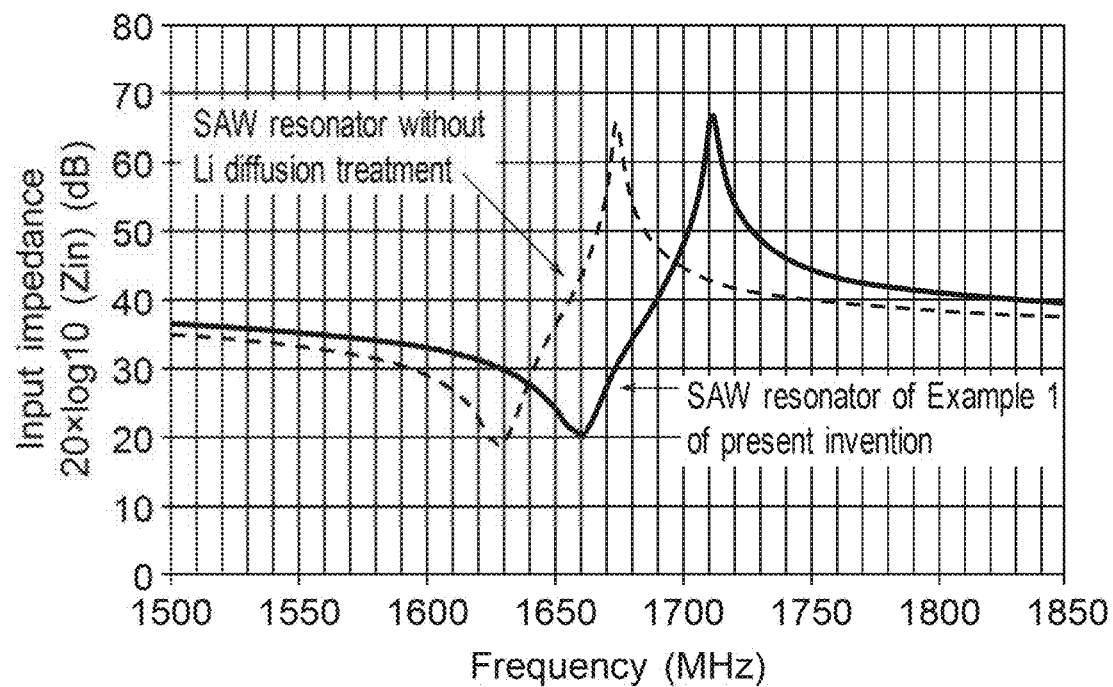
FIG. 3 A diagram showing SAW resonator waveforms of Example 1.

Next, a 1-port SAW resonator with a wavelength of 2.5 μm was fabricated from a 42° Y-cut lithium tantalate single crystal substrate subjected to the Li diffusion treatment of Example 1, and the SAW waveform shown in FIG. 3 was obtained. In FIG. 3, for the sake of comparison, a similar 1-port SAW resonator was also fabricated from a 42° Y-cut lithium tantalate single crystal substrate not subjected to Li diffusion treatment, and the results in the case of the thus obtained SAW waveforms are also shown in the figure.

From the results of the SAW waveforms of FIG. 3, the values of the anti-resonance frequency and the resonance frequency were obtained, and the electromechanical coupling coefficient k2 was calculated based on the following Equation 2; as shown in Table 1, in the case of the 42° Y-cut lithium tantalate single crystal substrate subjected to the Li diffusion treatment of Example 1, the electromechanical coupling coefficient k2 was 7.7%, and this was about 1.2 times greater than that in the case of the 42° Y-cut lithium tantalate single crystal substrate not subjected to Li diffusion treatment.

⟨ Equation 2 ⟩
Equation to obtain K²:

$$K^2=(\pi fr/2fa)/\tan(\pi fr/2fa)$$

Wherein fr is resonance frequency and fa is anti-resonance frequency.

Figure 4:
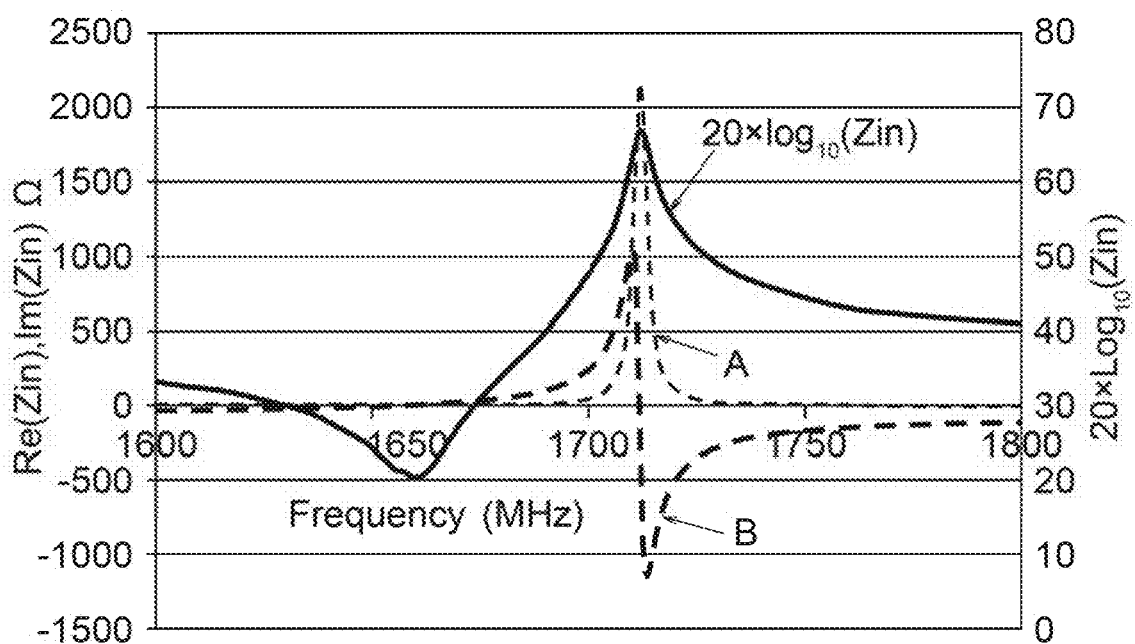
FIG. 4 A diagram showing values calculated by means of SAW resonator waveform, input impedance (Zin) real part/imaginary part display waveform and BVD model of Example 1.

FIG. 4 shows, with respect to the SAW resonator of Example 1, the relationship between the real/imaginary parts of the input impedance (Zin) and the frequency, and also FIG. 4 shows the calculated value of the input impedance obtained by using the following equation (3) according to the BVD model (ref. John D. et al., "Modified Butterworth-Van Dyke Circuit for FBAR Resonators and Automated Measurement System", IEEE ULTRASONICS SYMPOSIUM, 2000, pp. 863-868).

From the results of the graph curves A and B in FIG. 4, it was confirmed that the input impedance value measured in Example 1 well agrees with the calculated value in accordance with the BVD model.

Figure 5:
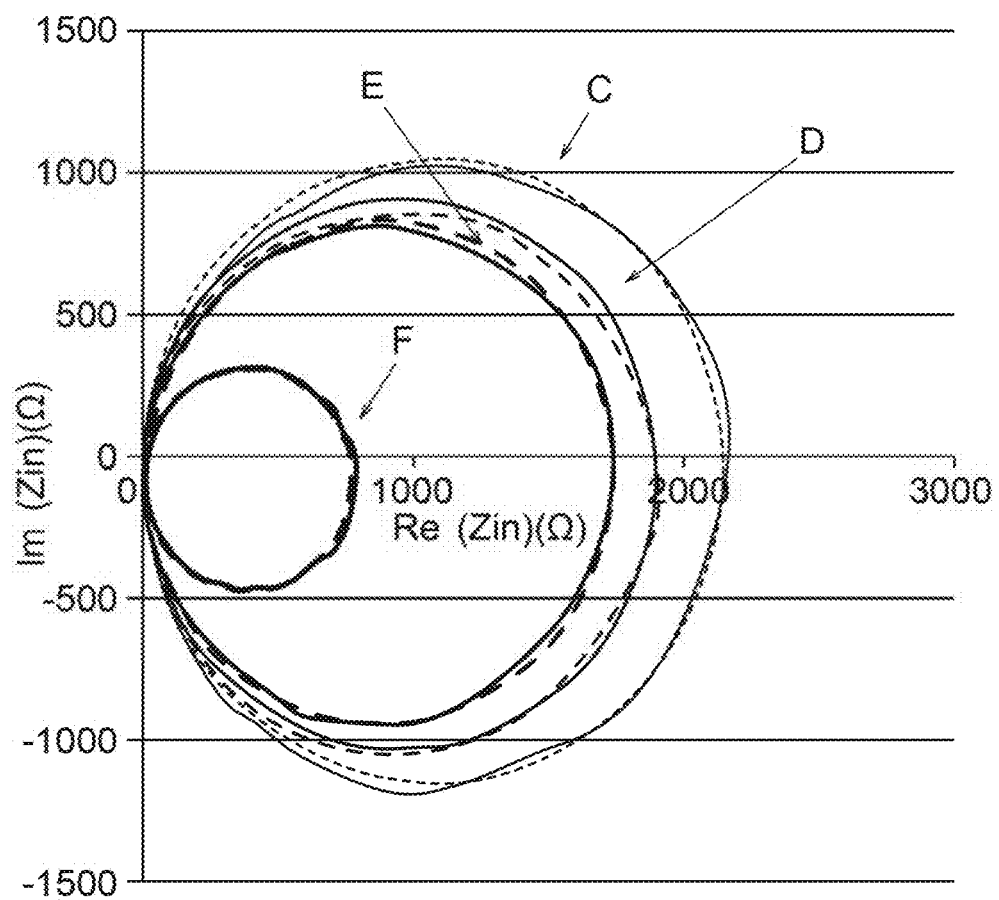
FIG. 5 A diagram showing values calculated by means of measured values of SAW resonator input impedance (Zin) in the cases of Example 1 and Comparative Examples 2 and 4 and the calculated value in the case of BVD model, where the real part is taken on the horizontal axis and the imaginary part is taken on the vertical axis.

Further, Table 1 shows the results of value Q as calculated using the following formula (3), and FIG. 5 shows the measured values of the Q circle of the SAW resonator together with the calculated values in accordance with the BVD model.

Now, in the Q circle, the real part of the input impedance (Zin) is plotted against the horizontal axis and the imaginary part of the input impedance (Zin) is plotted against the vertical axis.

From the result of the Q circle curve C in FIG. 5, it was confirmed that the value of the input impedance measured in Example 1 and the value calculated in accordance with the BVD model are in good agreement, so that the values of Q obtained by means of Equation (3), shown below, in accordance with the BVD model can be said reasonable values. Further, in the Q circle, it can be judged that if the radius is roughly large, the value of Q is also large.

In addition, in Table 1 and FIG. 5, for the sake of comparison, the results in the case of a 42° Y-cut lithium tantalate single crystal substrate not subjected to Li diffusion treatment (see the Q circle of curve D in FIG. 5) are also shown, and it was confirmed that the Q of Example 1 shows a value equal to or even higher than the Q of the 42° Y-cut lithium tantalate crystal substrate not subjected to Li diffusion treatment.

⟨ Equation 3 ⟩

$$z(\omega) = \frac{Xp}{j \cdot \left(\frac{\omega}{\omega_p}\right)} \cdot \frac{\left[1 - \left(\frac{\omega}{\omega s}\right)^2 + j \cdot \left(\frac{\omega}{\omega s}\right) \cdot \frac{1}{Qso}\right]}{\left[1 - \left(\frac{\omega}{\omega s}\right)^2 + j \cdot \left(\frac{\omega}{\omega_p}\right) \cdot \frac{1}{Qpo}\right]}$$

where:

$$r = \frac{C_0}{C_1} \quad \omega s = \frac{1}{\sqrt{L_1 \cdot C_1}} \quad \left(\frac{\omega p}{\omega_s}\right)^2 = 1 + \frac{1}{r}$$

$$X_p = \frac{1}{\omega p \cdot C_0} \quad \frac{1}{Q_s} = \omega_s \cdot R1 \cdot C1 \quad \frac{1}{Qe} = \frac{\omega_s \cdot R_0 \cdot C_0}{r}$$

$$\frac{1}{Qso} = \frac{1}{Qs} \cdot \left(1 + \frac{R_s}{R_1}\right) \quad \frac{1}{Q_{po}} = \left(\frac{\omega p}{\omega s}\right) \cdot \left(\frac{1}{Qs} + \frac{1}{Qc}\right)$$

Example 2

In Example 2, first, by means of the same method as in Example 1, a lithium tantalate single crystal substrate having a roughly uniform Li concentration in a region from the surface of the substrate to a depth of 18 μm was prepared. Next, the surface of the substrate was lapped to a depth of 2 μm, whereby a lithium tantalate single crystal substrate having a roughly uniform Li concentration in a region from the surface of the substrate to a depth of 16 μm was obtained.

Then, the thus obtained lithium tantalate single crystal substrate was evaluated in the same manner as in Example 1, and the results are shown in Table 1. When normalized with the wavelength of the leaky surface acoustic wave propagating in the direction X of the wafer, the region in which the Li concentration is uniform ranged from the substrate surface to a depth equivalent to 6.4 times the wavelength.

As compared with the 42° Y-cut lithium tantalate single crystal substrate to which Li diffusion treatment is not subjected, the lithium tantalate single crystal substrate of Example 2 had a larger electromechanical coupling coefficient k2, a better temperature non-dependency characteristic, and the values Q which were similar to or in average greater than those of the former.

Example 3

Also in Example 3, first, a lithium tantalate single crystal substrate having a region in which the Li concentration is substantially uniform from the substrate surface to a depth of 18 µm was prepared in the same manner as in Example 1. Next, the surface of the substrate was lapped to a depth of 4 µm, whereby a lithium tantalate single crystal substrate having a roughly uniform Li concentration in a region from the surface of the substrate to a depth of 14 µm was obtained.

Then, when the obtained lithium tantalate single crystal substrate was evaluated in the same manner as in Example 1, the results were as shown in Table 1. Also, when normalized with the wavelength of the leaky surface acoustic wave propagating in the direction X of the wafer, the region in which the Li concentration is uniform ranged from the substrate surface to a depth equivalent to 5.6 time the wavelength.

As compared with the 42° Y-cut lithium tantalate single crystal substrate to which Li diffusion treatment is not subjected, the lithium tantalate single crystal substrate of Example 3 had a larger electromechanical coupling coefficient $k^2$, better temperature non-dependency characteristic, and the values of Q which were similar to or in average greater than those of the former.

Example 4

Also in Example 4, first, a lithium tantalate single crystal substrate having a region in which the Li concentration is substantially uniform from the substrate surface to a depth of 18 µm was prepared in the same manner as in Example 1. Next, the surface of the substrate was lapped to a depth of 5.5 µm, whereby lithium tantalate single crystal substrates having a roughly uniform Li concentration in a region from the surface of the substrate to a depth of 12.5 µm was obtained.

Then, when the obtained lithium tantalate single crystal substrate was evaluated in the same manner as in Example 1, the results were as shown in Table 1. Also, when normalized with the wavelength of the leaky surface acoustic wave propagating in the direction X of the wafer, the region in which the Li concentration is uniform ranged from the substrate surface to a depth equivalent to 5.0 times the wavelength.

As compared with the 42° Y-cut lithium tantalate single crystal substrate to which Li diffusion treatment is not subjected, the lithium tantalate single crystal substrate of Example 4 had a larger electromechanical coupling coefficient k2, better temperature non-dependency characteristic, and the values Q which were similar to or in average greater than those of the former.

Example 5

In Example 5, first, a lithium tantalate single crystal substrate having a region in which the Li concentration is substantially uniform ranging from the substrate surface to a depth of 18 µm was prepared in the same manner as in Example 1. Next, this substrate and a 200-µm-thick Si substrate were bonded together by means of an ordinary temperature bonding method described in the non-IP publication [Takagi H. et al, "Room-temperature wafer bonding using argon beam activation" From Proceedings-Electrochemical Society (2001), 99-35 (Semiconductor Wafer Bonding: Science, Technology, and Applications V), 265-274.], and a bonded substrate was fabricated. Specifically, a cleansed substrate was set in a high-vacuum chamber and an activation treatment was performed upon the substrate by irradiating a high speed atomic beam of argon in which the ion beam was neutralized upon the substrate surface; thereafter the lithium tantalate single crystal substrate and the Si substrate were bonded together.

Figure 6:
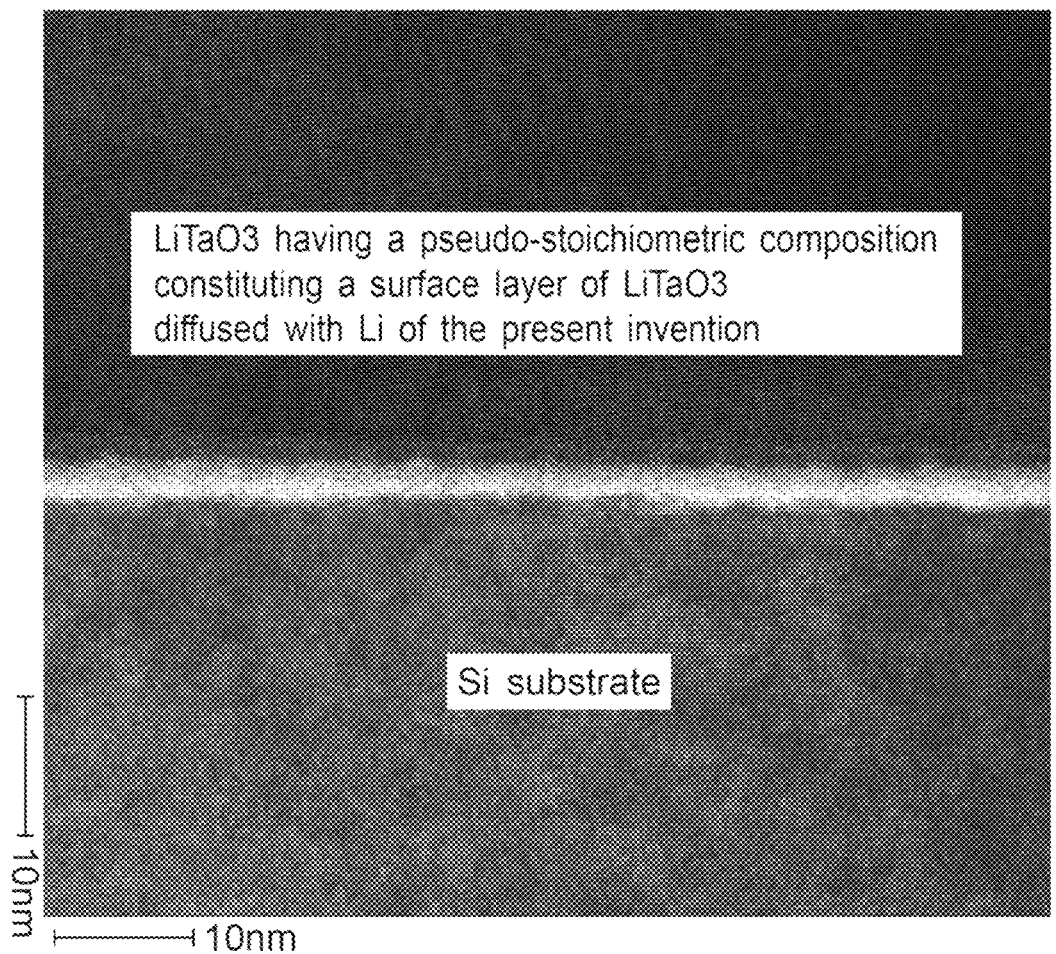
FIG. 6 A transmission electron microscopic photograph of a bonded substrate of Example 5 taken over an area of the interface between $LiTaO_3$ and Si.

The bonding interface of this bonded substrate was inspected with a transmission electron microscope, and it was observed, as shown in FIG. 6, that the pseudo-stoichiometric composition $LiTaO_3$ and the atoms of Si at the bonding interface were intermixed with each other to form a firm bonding.

In addition, this bonded substrate consisting of the rotated Y-cut $LiTaO_3$ substrate diffused with Li and the silicon substrate was lapped and polished on the $LiTaO_3$ side in a manner such that a $LiTaO_3$ layer with a thickness of 18 µm as measured from the bonding interface was left, whereupon a bonded substrate of the present invention was finished.

Next, the bonded substrate obtained in this way was evaluated in the same manner as in Example 1, and the results were as shown in Table 2. From these results, it was also confirmed that the bonded substrate of Example 5 also exhibited a large electromechanical coupling coefficient value and a large value Q, and excellent temperature non-dependency characteristic.

Example 6

In Example 6, first, a lithium tantalate single crystal substrate having a region in which Li concentration is substantially uniform raging from the substrate surface to a depth of 18 µm was prepared by the same method as in Example 1. Next, this substrate and a Si substrate with a thickness of 200 µm were joined by the ordinary temperature bonding method described in the above-mentioned non-IP publication and thus a bonded substrate was obtained.

The bonding interface of this bonded substrate was inspected with a transmission electron microscope, and it was observed like in the case of Example 5 that the pseudo-stoichiometric composition $LiTaO_3$ and the atoms of Si at the bonding interface were mutually intermixed to form a firm bonding.

In addition, this bonded substrate consisting of the rotated Y-cut $LiTaO_3$ substrate diffused with Li and the silicon substrate was lapped and polished on the $LiTaO_3$ side in a manner such that a $LiTaO_3$ layer with a thickness of 1.2 µm as measured from the bonding interface was left, whereupon a bonded substrate of the present invention was finished.

Next, the bonded substrate obtained in this way was evaluated in the same manner as in Example 1, and the results were as shown in Table 2. From these results, it was also confirmed that the bonded substrate of Example 6 also exhibited a large electromechanical coupling coefficient value and a large value Q, and an excellent temperature non-dependency characteristic.

COMPARATIVE EXAMPLES

In the comparative examples shown below, lithium tantalate single crystal substrates were prepared by the same method as in Example 1 except that no single polarization treatment was applied to them.

Comparative Example 1

In Comparative Example 1, during the period of temperature decrease from 770° C. through 500° C. after the Li diffusion treatment, no electric field was applied in an approximate direction of +Z (thus single polarization treatment was not performed), but in other respects, the lithium tantalate single crystal substrate was prepared by the same manner as in Example 1.

It was confirmed that the lithium tantalate single crystal substrate of Comparative Example 1 shows a similar Raman profile as in Example 1, and that the lithium tantalate single crystal substrate has a substantially uniform Li concentration to a depth of 18 μm from the substrate surface.

Next, a small piece was cut out from the Li-diffused 4-inch 42° Y cut lithium tantalate single crystal substrate obtained in Comparative Example 1, and, in a Piezo d33/d15 meter (model ZJ-3BN) manufactured by The Institute of Acoustics of the Chinese Academy of Sciences, the small piece was given a vertical vibration in the thickness direction to the principal face and also to the back face respectively to observe the voltage waveform thereby induced, and the observation indicated an absence of piezoelectric response from every part of the wafer. Hence it was confirmed that the lithium tantalate single crystal substrate of Example 1 does not possess thickness-wise piezoelectricity in every part of the substrate face and that it was not singly polarized.

On the other hand, when this small piece was set in the d15 unit and a vibration was applied in the horizontal direction parallel to the substrate, a piezoelectric response could be picked up in the thickness direction, so that the lithium tantalate single crystal substrate of Comparative Example 1 was found to have turned into an unusual piezoelectric body which exhibits piezoelectricity when it is given a vibration in the horizontal direction parallel to the substrate surface although it does not produce any piezoelectric response in the thickness direction in response to a vibration received in the thickness direction.

The same evaluation as in Example 1 was performed on the lithium tantalate single crystal substrate of Comparative Example 1, and the results are as shown in Table 1. From these results, it was confirmed that, as compared with the 42° Y cut lithium tantalate single crystal substrate not subjected to the Li diffusion treatment, the lithium tantalate single crystal substrate of Comparative Example 1 had a larger electromechanical coupling coefficient k2 and a superior temperature non-dependency characteristic while its values of Q were smaller.

Comparative Example 2

In Comparative Example 2, first, a lithium tantalate single crystal substrate having a substantially uniform Li concentration in a region ranging from the substrate surface to a depth of 18 μm was prepared by the same method as in Example 1. Next, the surface of this substrate was polished by 8 μm to prepare a lithium tantalate single crystal substrate having a substantially uniform Li concentration to a depth of 10 μm from the substrate surface.

The lithium tantalate single crystal substrate of Comparative Example 2 was evaluated in the same manner as in Example 1, and the results are shown in Table 1. Moreover, when normalized by the wavelength of the leaky surface acoustic wave propagating in the direction X of the wafer, the region in which the Li concentration was uniform ranged from the substrate surface to a depth of 4.0 times the wavelength.

From these results, it was confirmed that, as compared with the 42° Y cut lithium tantalate single crystal substrate not subjected to the Li diffusion treatment, the lithium tantalate single crystal substrate of Comparative Example 2 had a larger electromechanical coupling coefficient k2 and a superior temperature non-dependency characteristic while its values of Q were smaller, as shown by the Q circle curve in FIG. 5.

Comparative Example 3

In Comparative Example 3, first, a lithium tantalate single crystal substrate having a substantially uniform Li concentration in a region ranging from the substrate surface to a depth of 18 μm was prepared by the same method as in Example 1. Next, the surface of this substrate was polished by 12 μm to prepare a lithium tantalate single crystal substrate having a substantially uniform Li concentration to a depth of 8 μm from the substrate surface.

The lithium tantalate single crystal substrate of Comparative Example 3 was evaluated in the same manner as in Example 1, and the results are shown in Table 1. Moreover, when normalized by the wavelength of the leaky surface acoustic wave propagating in the direction X of the wafer, the region in which the Li concentration was uniform ranged from the substrate surface to a depth of 3.2 times the wavelength.

From these results, it was confirmed that, as compared with the 42° Y cut lithium tantalate singe crystal substrate not subjected to the Li diffusion treatment, the lithium tantalate single crystal substrate of Comparative Example 3 had a larger electromechanical coupling coefficient k2 and a superior temperature non-dependency characteristic while its values of Q were smaller.

Comparative Example 4

In Comparative Example 4, first, a lithium tantalate single crystal substrate having a substantially uniform Li concentration in a region ranging from the substrate surface to a depth of 18 μm was prepared by the same method as in Example 1. Next, the surface of this substrate was polished by 14 μm to prepare a lithium tantalate single crystal substrate having a substantially uniform Li concentration to a depth of 8 μm from the substrate surface.

The lithium tantalate single crystal substrate of Comparative Example 4 was evaluated in the same manner as in Example 1, and the results obtained are shown in Table 1. Furthermore, when normalized by the wavelength of the leaky surface acoustic wave propagating in the direction X of the wafer, the region in which the Li concentration was uniform ranged from the substrate surface to a depth equivalent to 2.4 times the wavelength.

From these results, it was confirmed that, as compared with the 42° Y cut lithium tantalate single crystal substrate not subjected to the Li diffusion treatment, the lithium tantalate single crystal substrate of Comparative Example 3 had a larger electromechanical coupling coefficient k2 and a superior temperature non-dependency characteristic while its values of Q were smaller, as shown by the Q circle curve in FIG. 5.

TABLE 1

| | Depth from substrate surface through which Li conc. is uniform (μm) | Depth from substrate surface through which Li conc. is uniform as normalized in terms of times of wavelength of leaky acoustic wave propagating in the LiTaO3 substrate surface (×wavelength) | $Q_s$ | $Q_e$ | $Q_{a0}$ | $Q_{p0}$ | $Q_{ave.}$ | Resonance frequency (MHz) | Anti-resonance frequency (MHz) | k2 (%) | Temperature coefficient of resonance frequency (ppm/° C.) |
|---|---|---|---|---|---|---|---|---|---|---|---|
| Example 1 | 18 | 7.2 | 957 | 1118 | 900 | 500 | 869 | 1658.0 | 1712.0 | 7.7 | −21 |
| Example 2 | 16 | 6.4 | 1070 | 1204 | 600 | 550 | 856 | 1659.0 | 1712.0 | 7.5 | −22 |
| Example 3 | 14 | 5.6 | 957 | 1118 | 900 | 500 | 869 | 1659.0 | 1712.5 | 7.6 | −21 |
| Example 4 | 12.5 | 5.0 | 1020 | 1100 | 750 | 550 | 855 | 1658.0 | 1712.0 | 7.7 | −23 |
| Comparative Example 1 | 18 | 7.2 | 700 | 370 | 274 | 455 | 450 | 1653.0 | 1709.0 | 7.9 | −23 |
| Comparative Example 2 | 10 | 4.0 | 801 | 682 | 750 | 360 | 648 | 1659.0 | 1712.8 | 7.6 | −22 |
| Comparative Example 3 | 8 | 3.2 | 773 | 603 | 600 | 330 | 577 | 1658.0 | 1713.0 | 7.8 | −23 |
| Comparative Example 4 | 6 | 2.4 | 804 | 241 | 150 | 180 | 344 | 1653.5 | 1708.0 | 7.7 | −23 |
| No Li diffusion treatment | — | — | 1105 | 1202 | 500 | 560 | 842 | 1628.0 | 1672.0 | 6.4 | −33 |

TABLE 2

| | Thickness of LiTaO3 in bonded substrate (μm) | $Q_s$ | $Q_e$ | $Q_{a0}$ | $Q_{p0}$ | $Q_{ave.}$ | Resonance frequency (MHz) | Anti-resonance frequency (MHz) | k2 (%) | Temperature coefficient of resonance frequency (ppm/° C.) | Temperature coefficient of anti-resonance frequency (ppm/° C.) |
|---|---|---|---|---|---|---|---|---|---|---|---|
| Example 5 | 15 | 1535 | 1453 | 1500 | 1150 | 1410 | 1685.0 | 1742.0 | 8.1 | −10 | −20 |
| Example 6 | 12 | 1950 | 1847 | 1700 | 1837 | 1834 | 1724.0 | 1803.0 | 10.5 | 10 | −10 |

EXPLANATION OF DESIGNATIONS

A: graph curves (solid line and dotted line) representing Im (Zin) measured values and calculated values in accordance with BVD model in FIG. 4

B: Graph curves (solid line and dotted line) representing Re (Zin) measured values and calculated values in accordance with BVD model in FIG. 4

C: Q circle curves in FIG. 5 representing measured values of the input impedance (Zin) of Example 1 (solid line) and the calculated values in accordance with the BVD model (dotted line)

D: Q circle curves in FIG. 5 representing measured values of input impedance (Zin) in the case of no Li diffusion treatment (solid line) and calculated values in accordance with the BVD model (dotted line)

E: Q circle curves in FIG. 5 representing measured values of the input impedance (Zin) of Comparative Example 2 (in the case wherein the depth of uniform Li concentration region from the substrate surface is 10 μm) (solid line) and the calculated values in accordance with the BVD model (dotted line)

F: Q circle curves in FIG. 5 representing measured values of the input impedance (Zin) of Comparative Example 4 (in the case wherein the depth of uniform Li concentration region from the substrate surface is 6 μm) (solid line) and the calculated values in accordance with the BVD model (dotted line)

The invention claimed is:

1. A method of manufacturing a bonded substrate, comprising:

bonding a base substrate to a LiTaO₃ single crystal substrate which has a concentration profile wherein Li concentration is different between a substrate surface and an inner part of the substrate and wherein Li concentration is substantially uniform in a region ranging from at least one of the substrate's surfaces to a depth; and removing a LiTaO₃ surface layer opposite the bonding face in a manner such that at least part of said region where the Li concentration is substantially uniform is left, wherein the LiTaO₃ single crystal substrate is doped with Fe at a concentration of 25 ppm to 150 ppm.

2. The method of claim 1, wherein that region in which the Li concentration is substantially uniform is of a pseudo-stoichiometric composition.

3. The method of claim 1, wherein the LiTaO₃ single crystal substrate is diffused with Li from the LiTaO₃ single crystal substrate having a crystal orientation of 36° Y-49° Y cut into depth thereof such that the substrate has a Li concentration profile showing the difference in the Li concentration between the substrate surface and the depth of the substrate; the substrate is treated with single polarization treatment so that the Li concentration is substantially uniform from the substrate surface to a depth which is equivalent to 5-15 times the wavelength of either a surface acoustic wave or leaky surface acoustic wave propagating in the LiTaO₃ substrate surface; and the wavelength is 2.5 μm.

4. The method of claim 1, wherein the LiTaO₃ single crystal substrate has a region which exhibits a concentration profile such that the Li concentration is higher in areas closer to the substrate surface, and the Li concentration decreases with depth of the substrate in the thickness direction.

5. The method of claim 1, wherein the base substrate is made of Si, SiC, or spinel.

6. The method of claim 1, wherein the base substrate comprises Si.

7. The method of claim 1, wherein the base substrate comprises SiC.

8. The method of claim 1, wherein the base substrate comprises spinel.

9. A method of manufacturing a bonded substrate, comprising:

bonding a base substrate to a $LiTaO_3$ single crystal substrate which has a concentration profile wherein Li concentration is different between a substrate surface and an inner part of the substrate and wherein Li concentration is substantially uniform in a region ranging from at least one of the substrate's surfaces to a depth; and removing a $LiTaO_3$ surface layer opposite the bonding face in a manner such that only said region where the Li concentration is substantially uniform is left, wherein the $LiTaO_3$ single crystal substrate is doped with Fe at a concentration of 25 ppm to 150 ppm.

10. The method of claim 9, wherein that region in which the Li concentration is substantially uniform is of a pseudo-stoichiometric composition.

11. The method of claim 9, wherein the base substrate comprises Si, SiC, or spinel.

12. The method of claim 9, wherein the base substrate comprises Si.

13. The method of claim 9, wherein the base substrate comprises SiC.

14. The method of claim 9, wherein the base substrate comprises spinel.

* * * * *